United States Patent
Cho et al.

(10) Patent No.: US 8,138,077 B2
(45) Date of Patent: Mar. 20, 2012

(54) FLASH MEMORY DEVICE AND METHOD OF FABRICATING THE SAME

(75) Inventors: Whee Won Cho, Cheongju-si (KR); Nam Woo So, Anyang-si (KR); Cheol Mo Jeong, Icheon-si (KR); Eun Gyeong Jang, legal representative, Icheon-si (KR); Jung Geun Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 233 days.

(21) Appl. No.: 12/464,947

(22) Filed: May 13, 2009
(Under 37 CFR 1.47)

(65) Prior Publication Data
US 2009/0283818 A1    Nov. 19, 2009

(30) Foreign Application Priority Data

May 13, 2008    (KR) .................. 10-2008-0044117
Jan. 29, 2009    (KR) .................. 10-2009-0006800

(51) Int. Cl.
*H01L 29/788* (2006.01)

(52) U.S. Cl. ........ 438/591; 438/257; 438/259; 438/287; 257/315; 257/321; 257/E21.422

(58) Field of Classification Search .................. 438/257, 438/259, 261–262, 264, 287, 591; 257/315, 257/321, 324–325
See application file for complete search history.

(56) References Cited

U.S. PATENT DOCUMENTS

| | | | |
|---|---|---|---|
| 6,548,336 B2 | 4/2003 | Avanzino et al. | |
| 6,720,610 B2 | 4/2004 | Iguchi et al. | |
| 7,005,714 B2 | 2/2006 | Ozawa et al. | |
| 7,151,295 B2 | 12/2006 | Yaegashi et al. | |
| 2006/0043465 A1* | 3/2006 | Terauchi | 257/316 |
| 2007/0128798 A1* | 6/2007 | Lee | 438/257 |
| 2007/0278562 A1* | 12/2007 | Iguchi et al. | 257/316 |
| 2008/0076213 A1* | 3/2008 | Hsieh et al. | 438/197 |
| 2008/0081417 A1* | 4/2008 | Choi | 438/261 |
| 2008/0093653 A1* | 4/2008 | Park et al. | 257/316 |
| 2009/0109752 A1* | 4/2009 | Aritome | 365/185.05 |

FOREIGN PATENT DOCUMENTS

| | | |
|---|---|---|
| KR | 1020060008555 | 1/2006 |
| KR | 1020080035356 | 4/2008 |

* cited by examiner

*Primary Examiner* — A. Sefer
(74) *Attorney, Agent, or Firm* — IP & T Group LLP

(57) ABSTRACT

A flash memory device includes an isolation layer formed on an isolation region of a semiconductor substrate, a tunnel insulating layer formed on an active region of the semiconductor substrate, a first conductive layer formed over the tunnel insulating layer, a dielectric layer formed on the first conductive layer and the isolation layer, a first trench penetrating the dielectric layer on the isolation layer to separate parts of the dielectric layer, a second trench formed on the isolation layer and expanded from the first trench, and a second conductive layer formed over the dielectric layer to fill the first and second trenches.

31 Claims, 7 Drawing Sheets

FLASH MEMORY DEVICE AND METHOD OF FABRICATING THE SAME

CROSS-REFERENCES TO RELATED APPLICATIONS

This application claims priority from Korean Patent Application No. 10-2008-0044117, filed on May 13, 2008 and Korean Patent Application No. 10-2009-0006800, filed on Jan. 29, 2009, the contents of which are incorporated herein by reference in their entireties.

BACKGROUND

One or more embodiments relate to a flash memory device and a method of fabricating the same, and more particularly, to a flash memory device and a method of fabricating the same, is capable of improving interference effect between neighbor cells and a cycling threshold voltage shift.

In a NAND type flash memory device, a plurality of cells for storing data is electrically connected to each other in series, thereby forming one cell string. A drain selection transistor is formed between the cell string and a drain, and a source selection transistor is formed between the cell string and a source. The cell of the NAND type flash memory device is formed by forming gates on certain areas of a semiconductor substrate and then forming junctions on both sides of each of the gates. The gate has a stack structure of a tunnel insulating layer, a floating gate, a dielectric layer, and a control gate.

In the above NAND type flash memory device, the state of the cell is influenced by the operations of the neighbor cells, and so it is important to maintain constantly the state of the cell. A change in the state of the cell resulting from operations (in particular, the program operation of neighbor cells) is called an "interference effect." In other words, the interference effect refers to a phenomenon where, when a first cell to be read is read, a threshold voltage higher than that of the first cell is read because of the effect of capacitance resulting from a change in the charges of the floating gate of a second cell when the second cell adjacent to the first cell is programmed. The interference effect also refers to a phenomenon where, although the charges of the floating gate of a cell being read is not changed, the state of the cell seems to be distorted by a change in the states of neighbor cells. The state of a cell is changed because of the interference effect, which results in an increase in the ratio of faulty devices and a decrease in the production yield. Accordingly, in order to constantly maintain the state of a cell, it is useful to minimize the interference effect.

As the integration degree of semiconductor devices increases, the distance between the floating gates decreases, and the interference becomes an important factor. Accordingly, attempts have been made to reduce the interference. For example, it was proposed a method of forming an isolation layer 17 having a wing spacer W formed on the sidewalls of a tunnel oxide layer 13 on a semiconductor substrate 11, as shown in FIG. 1, instead of forming a flat-shaped dielectric layer. A dielectric layer 19 and a control gate 21 are formed over the isolation layer 17.

This wing spacer W is formed by lowering the Effective Field Oxide Height (EFH) at the central portion of a top surface of the isolation layer 17 than the height of the isolation layer 17 formed on the sidewalls of the tunnel oxide layer 13. The top surface of the isolation layer 17 is configured to have a U shape through the formation of the wing spacer W. Accordingly, the surface of the dielectric layer 19 formed over the isolation layer 17 will have a U shape, and the control gate 21 formed over the dielectric layer 19 having the U shape is formed deep between the floating gates 15. As described above, the control gate 21 formed between the floating gates 15 could improve the interference effect.

However, if the EFH at the central portion of the top surface of the isolation layer 17 is lowered as described above, a distance between the tunnel oxide layer 13 and the control gate 21 is reduced. Accordingly, the properties of the tunnel oxide layer 13 may be deteriorated because a cycling Vt shift of the tunnel oxide layer 13 is increased.

Meanwhile, if the distance between the wing spacers W of the isolation layer 17 decreases because the distance between the floating gates 15 decreases due to the high integration of devices, the dielectric layer 19 may fill the distance between the wing spacer W. Consequently, it is very difficult to improve the interference effect because, as the control gate 21 is formed deep between the floating gates 15, the bottom of the control gate 21 cannot be lowered.

BRIEF SUMMARY

One or more embodiments are directed towards a flash memory device and a method of fabricating the same, which is capable of improving the interference effect and securing the distance between the tunnel oxide layer and the control gate although the distance between cells decreases.

A flash memory device according to embodiment may include an isolation layer formed on an isolation region of a semiconductor substrate; a tunnel insulating layer formed on an active region of the semiconductor substrate; a first conductive layer formed on the tunnel insulating layer; and a dielectric layer formed on the first conductive layer and the isolation layer. A first trench may penetrate the dielectric layer on the isolation layer to separate parts of the dielectric layer. A second trench may be formed on the isolation layer and extended from the first trench, and a second conductive layer may be formed on the dielectric layer to fill the first trench.

In flash memory device in accordance with an embodiment, the isolation layer may be formed such that a surface of the isolation layer is located over a surface of the active region of the semiconductor substrate and under a surface of the first conductive layer.

The first trench may be formed at a central portion of a top of the isolation layer.

The second trench may be formed at a central portion of the isolation layer. In addition, the second trench extends up to a depth corresponding to a surface of the active region of the semiconductor substrate.

A method of fabricating a flash memory device according to embodiment may include providing a semiconductor substrate having an isolation region and an active region formed thereon. The isolation region may have an isolation layer formed thereon, and the active region may have a stack layer formed thereon and configured to include a tunnel insulating layer and a first conductive layer.

The method may further include forming a dielectric layer on the isolation layer and the first conductive layer; etching the dielectric layer formed on the isolation layer, wherein the etched dielectric layer includes a first trench; etching the isolation layer exposed through the first trench, wherein the etched dielectric layer includes a second trench; and forming a second conductive layer on the dielectric layer to fill the first and second trench.

In the method according to one or more embodiments, a top surface of the isolation layer is located between a top surface of the active region of the semiconductor substrate and a top surface of the first conductive layer.

The first trench may be formed at the central portion of a top of the isolation layer.

The second trench may be formed at the central portion of the isolation layer. The second trench may extend up to a depth corresponding to a surface of the active region of the semiconductor substrate.

In accordance with various embodiments, etching the dielectric layer may include forming an etch barrier layer on the dielectric layer, a portion of which corresponding to the first conductive layer being thicker than a portion of which corresponding to the isolation layer; and etching the etch barrier layer between vertical portions of the etch barrier layer and the dielectric layer so as to separate the dielectric layer of a cell from the dielectric layer of an adjacent cell.

The etch barrier layer may be formed using any one of an amorphous carbon layer, a carbon-based material layer, a silicon nitride (SixNy: "x" and "y" are positive integers) layer, a silicon oxynitride (SiON) layer, an oxide layer, and a boron nitride (BN) layer.

The etch barrier layer may be formed using a plasma enhanced chemical vapor deposition (PECVD) method or a spin coating method.

The first trench may be formed using a first etch process using only dry etch or a second etch process of using both dry etch and wet etch.

The second etch process includes a dry etch process performed in order to etch the etch barrier layer between the vertical portions of the etch barrier layer and a wet etch process of etching the exposed dielectric layer after the dry etch process and using the remained etch barrier layer as a mask.

The etch barrier layer may be removed forming the second trench.

The method may further include forming a capping layer performed between forming the etch barrier layer and forming the dielectric layer.

The capping layer may be formed through a PECVD method, and the capping layer may be formed using a polysilicon layer.

The capping layer may be etched using a wet etch process using the remaining etch barrier layer as a mask after the etch barrier layer between the vertical portions of the etch barrier layer is etched using dry etch process.

Method in accordance with various embodiments may further include forming a photoresist pattern on the etch barrier layer for exposing the etch barrier layer between the vertical portions of the etch barrier layer. Forming the photoresist pattern may be performed between forming the etch barrier layer and etching of the dielectric layer.

Method in accordance with various embodiments may further include the step of performing a cleaning process or a plasma process of removing carbon component remaining on the semiconductor substrate. The cleaning process or the plasma process may be performed between forming of the second trench and forming of the second conductive layer.

BRIEF DESCRIPTION OF THE DRAWINGS

The above and other features and advantages will become readily apparent by reference to the following detailed description when considered in conjunction with the accompanying drawings wherein.

DESCRIPTION OF SPECIFIC EMBODIMENT

Hereinafter, the present disclosure will be described in detail in connection with one or more embodiments with reference to the accompanying drawings.

FIGS. 2A to 2E are sectional views of a flash memory device illustrating a method of fabricating a flash memory device according to one embodiment.

Figure 1:
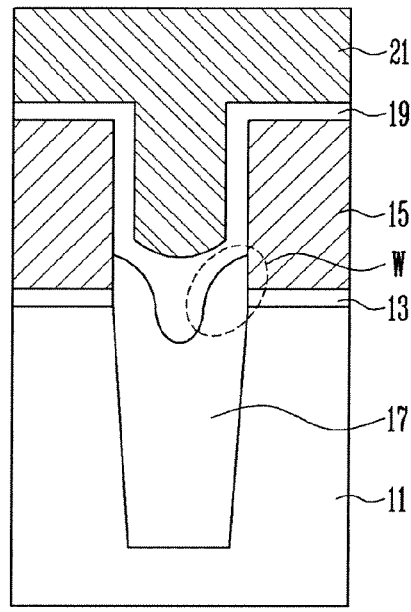
FIG. 1 is a sectional view of a flash memory device according to a known art.
Figure 2A:
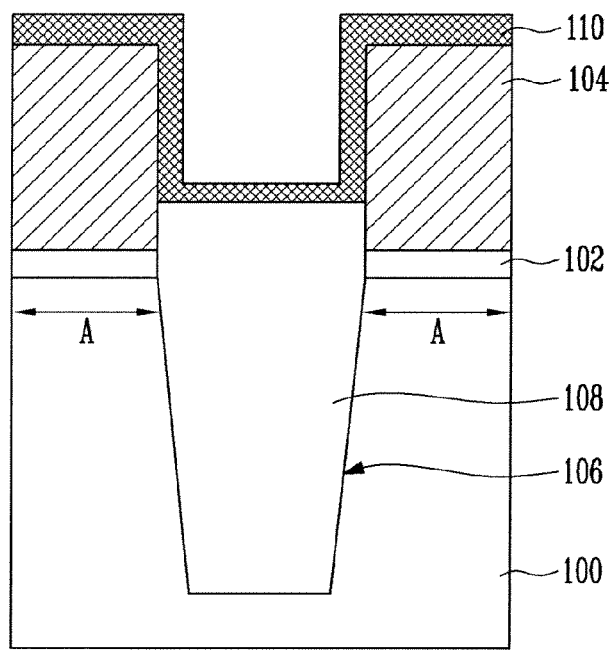
FIGS. 2A to 2E are sectional views illustrating a method of fabricating a flash memory device according to one embodiment.

Referring to FIG. 2A, a semiconductor substrate 100 is provided. Stack layers, each including a tunnel insulating layer 102 and a first conductive layer 104, are formed over respective active regions A of the semiconductor substrate using a known method of fabricating a flash memory device. An isolation layer 108 is formed in the isolation trench 106 of an isolation region of the semiconductor substrate. The sidewalls of the top of the first conductive layer 104 are exposed through the isolation trench 106. The tunnel insulating layer 102 may be formed of a silicon oxide (SiO2) layer. In one exemplary embodiment, the silicon oxide layer may be formed using an oxidation process. The first conductive layer 104 is used as the floating gate of the flash memory device and may be formed of a polysilicon layer. Here, the conductive layer 104 is patterned in a direction (a bit line direction) which is parallel to the isolation layer 108. The isolation trench 106 may be formed using a self-aligned shallow trench isolation (SA-STI) process of sequentially forming the tunnel insulating layer 102, the first conductive layer 104, and an isolation mask (not shown) over the semiconductor substrate 100. The isolation mask of the isolation region, the first conductive layer 104, the tunnel insulating layer 102, and the semiconductor substrate 100 are etched to a certain depth by an etch process using a mask (not shown).

The isolation layer 108 may be formed of an oxide-based material, such as a high temperature oxide (HTO) layer, a high density plasma (HDP) oxide layer, a tetraethyl orthosilicate (TEOS) layer, a boron-phosphorus silicate glass (BPSG) layer, or an undoped silicate glass (USG) layer. The isolation layer 108 may be formed by depositing an insulating layer on the isolation mask including the isolation trench 106 for filling the isolation trench 106, polishing the insulating layer, and then performing an etch process in order to reduce the thickness of the isolation layer. A chemical mechanical polishing process using the isolation nitride layer of the isolation mask as an etch-stop layer is performed as the polishing process. Here, the isolation layer 108 is formed so that the top surface of the isolation layer is higher than the top surface of the active region A of the semiconductor substrate 100 by taking a cycling characteristic into consideration. The top surface of the isolation layer 108 is higher than the bottom surface of the first conductive layer 104, thereby being capable of exposing the sidewalls of an upper portion of the first conductive layer 104. After the isolation layer 108 is formed, the remaining isolation nitride layer is removed. In the meantime, after the insulating layer is polished, the remaining isolation nitride layer is removed, and an etch process of reducing the thickness of the isolation layer may be then performed. The active region A is defined through the formation of the isolation trench 106 and the isolation layer 108.

Although not shown in the drawing, a wall oxide layer is further formed on the sidewalls and bottom surface of the isolation trench 106 in order to recover etching damage occurring in the etch process of forming the isolation trench 106. The wall oxide layer may be formed using an oxidation process after the isolation trench 106 is formed.

A dielectric layer 110 is formed on the isolation layer 108 and on a top surface of the first conductive layer 104. The dielectric layer 110, although shown in the drawing as being homogenous, may have a stack structure, including a first oxide layer, a nitride layer, and a second oxide layer (ONO). In this case, the dielectric layer 110 may be formed using a plasma enhanced chemical vapor deposition (PECVD) method.

Since the step coverage of the dielectric layer 110 is low because of a deposition characteristic of the formation process, the dielectric layer formed on the first conductive layer 104 is thicker than the dielectric layer formed on the sidewalls of the first conductive layer 104 and the dielectric layer formed on the isolation layer 108. Further, the dielectric layer formed on the sidewalls of the first conductive layer 104 is thicker than the dielectric layer formed on the isolation layer 108. Due to the above structure, the dielectric layer 110 has a flat shape.

Figure 2B:
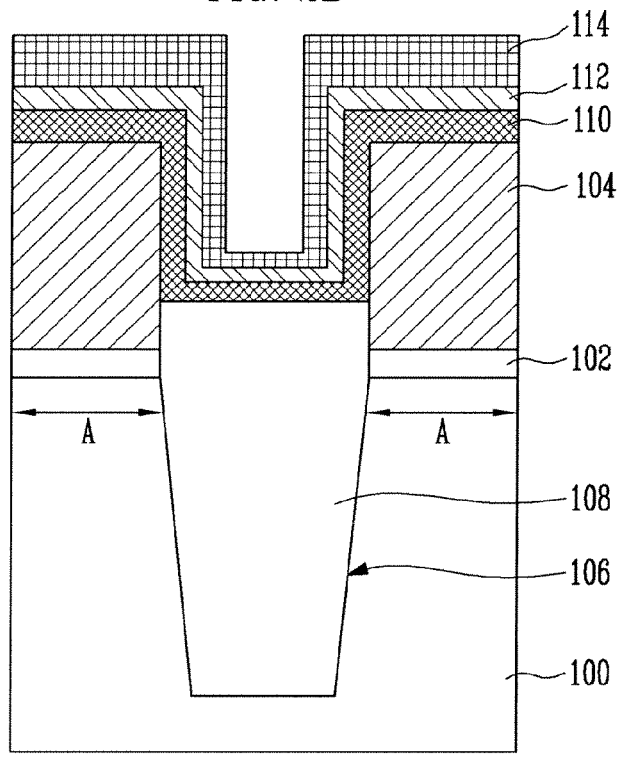

Referring to FIG. 2B, a liner-shaped capping layer 112 is formed on the dielectric layer 110. The capping layer 112 functions to protect the dielectric layer 110 so that the dielectric layer 110 is directly exposed in a subsequent etch process, cleaning process, and strip process. The capping layer may be formed of a polysilicon layer so that the capping layer can be used as an underlying conductive layer for a control gate in the flash memory device. In particular, in order to prevent impurities, injected into the capping layer 112, from being diffused into a lower portion, the capping layer 112 may have a stack layer, including an undoped polysilicon layer and a doped polysilicon layer.

The capping layer 112 may be formed using a PECVD method. Since the step coverage of the capping layer 112 is low due to a deposition characteristic of the formation process, the capping layer 112 formed on the dielectric layer 110 is thicker than the capping layer 112 formed on the sidewalls of the dielectric layer 110 and the capping layer formed on the dielectric layer 110 in the area of the isolation layer 108, and the capping layer formed on the sidewalls of the dielectric layer 110 is thicker than the capping layer formed on the dielectric layer 110 in the isolation area of the isolation layer 108.

An etch barrier layer 114 is formed on the capping layer 112 in a subsequent process of separating the second insulating layer 112 of a cell from that of a neighbor cell. The etch barrier layer 114 may be formed by a PECVD method or a spin coating method using amorphous carbon so that the conductive layer 112 and the dielectric layer 110 of a cell can be effectively separated from those of a neighbor cell though a subsequent etchback process according to the difference between a thickness of the etch barrier layer 114 formed on the first conductive layer 104 and a thickness of the etch barrier layer formed on the isolation layer 108.

On the other hand, the etch barrier layer 114 may be formed using a spin coating method using carbon-based material including carbon as one of the main components, such as carbon polymer, instead of amorphous carbon. Instead of the carbon-based material, a thin layer, such as a silicon nitride (SixNy: "x" and "y" are positive integers) layer, a silicon oxynitride (SiON) layer, an oxide layer, or boron nitride (BN) layer, may be formed as the etch barrier layer 114 using a PECVD method. Accordingly, the etch barrier layer 114 formed over the first conductive layer 104 is thicker than the etch barrier layer formed on the sidewalls of the capping layer 112 and the etch barrier layer formed on the isolation layer 108, and the etch barrier layer formed on the sidewalls of the capping layer 112 is thicker than the etch barrier layer formed on the isolation layer 108.

Figure 2C:
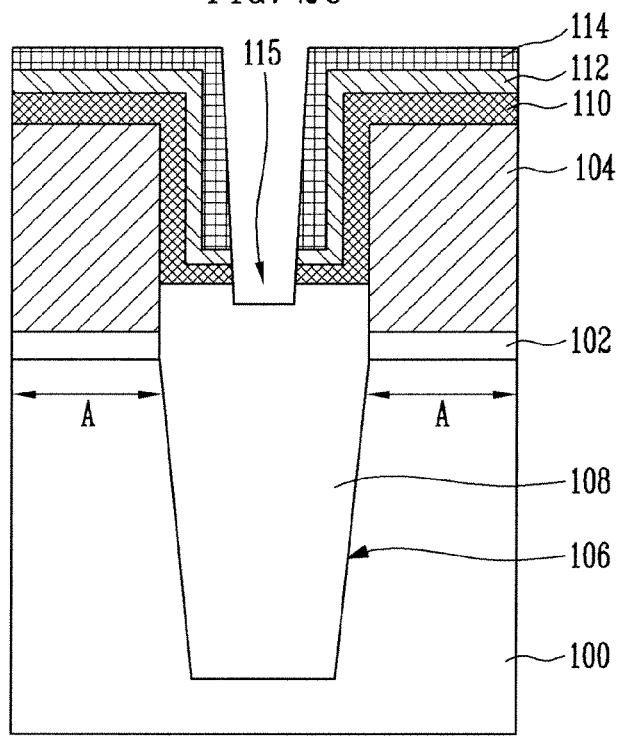

Referring to FIG. 2C, in order to separate the capping layer 112 and the dielectric layer 110 of a cell from those of a neighbor cell, the etch barrier layer 114, the capping layer 112, and the dielectric layer 110 are etched, thereby forming a first trench 115 through which the isolation layer 108 is exposed. Here, the etch process may be performed using a first process using only dry etch or a second process using both dry etch and wet etch.

In the case where the first etch process is performed, the etch barrier layer 114, the capping layer 112, and the dielectric layer 110 are sequentially etched using a dry etchback process. Here, in the dry etchback process, an etching target is set to a thickness by which the dielectric layer 110 of a cell can be separated from that of a neighbor cell through the formation of the first trench 115.

Accordingly, the etch barrier layer 114, the capping layer 112, and the dielectric layer 110 between the vertical portions of the etch barrier layer 114 are sequentially etched, thereby forming the first trench 115. Thus, the dielectric layer 110 of a cell is separated from that of a neighbor cell, and the surface of the isolation layer 108 is exposed through the first trench 115. Since the horizontal portion of the etch barrier layer 114, the capping layer 112, and the dielectric layer 110 is thick over the first conductive layer 104, and the horizontal portion of the etch barrier layer 114, the capping layer 112, and the dielectric layer 110 is relatively thin on the isolation layer 108 for separating the dielectric layer 110. Accordingly, the dielectric layer 110 can be separated, and the isolation layer 108 can be exposed. In this case, the first trench 115 of the dielectric layer 110 is formed at the central portion of a top of the isolation layer 108.

After the dry etchback process, the vertical portion of the etch barrier layer 114, having a thickness larger than that of the horizontal portion, remains on the sidewalls of the capping layer 112. After the dry etchback process, a portion of the etch barrier layer 114 formed over the first conductive layer 104 and configured to be thicker than the portion formed on the isolation layer 108 may remain on the conductive layer 104, or the capping layer 112 formed over the first conductive layer 104 may be partially etched.

In the case where the second etch process is performed, the etch process may be performed as follows. The etch barrier layer 114 is etched using a dry etch process (for example, a dry etchback process). Here, an etch target of the dry etchback process is set to a thickness of the horizontal portion of the etch barrier layer 114 formed in the isolation area of the isolation layer 108. Consequently, the horizontal portion of the etch barrier layer 114 formed over the isolation layer 108 is etched by the dry etchback process, thereby exposing the surface of the capping layer 112 at the central portion of the upper portion of the isolation layer 108.

However, the vertical portion of the etch barrier layer 114, which is relatively thicker than the horizontal portion, remains on the sidewalls of the capping layer 112 after the dry etchback process. The portion of the etch barrier layer 114 formed on the first conductive layer 104, which is thicker than the portion of the etch barrier layer 114 formed in the isolation area of the isolation layer 108, remains on the conductive layer 104.

Next, an exposed portion of the capping layer 112 and the dielectric layer 110 formed under the capping layer 112 are etched using a wet etch process (for example, a wet etchback process) using the remaining etch barrier layer 114 as a mask. Accordingly, the first trench 115 is formed. Consequently, the dielectric layer 110 of a cell is separated from that of a neighbor cell, and the surface of the isolation layer 108 is exposed through the first trench. As described above, the horizontal portions of the etch barrier layer 114, the capping layer 112, and the dielectric layer 110, formed over the first conductive layer 104, are configured to have a thick thickness, and the horizontal portion of the etch barrier layer 114, the capping layer 112, and the dielectric layer 110, formed over the isolation layer 108 for separating the dielectric layer 110, is configured to have a relatively thin thickness. Accordingly, the separation of the dielectric layer 110 and the exposure of the isolation layer 108 can be realized. Here, the first trench 115 of the dielectric layer 110 is formed at the central portion of the upper portion of the isolation layer 108.

Photoresist pattern (not shown) through which space between the vertical portions of the etch barrier layer 114 is exposed may be further formed on the etch barrier layer 114. An etch process using the photoresist layer pattern as a mask may be then performed in order to separate the dielectric layer in the cell from that of a neighbor cell.

Figure 2D:
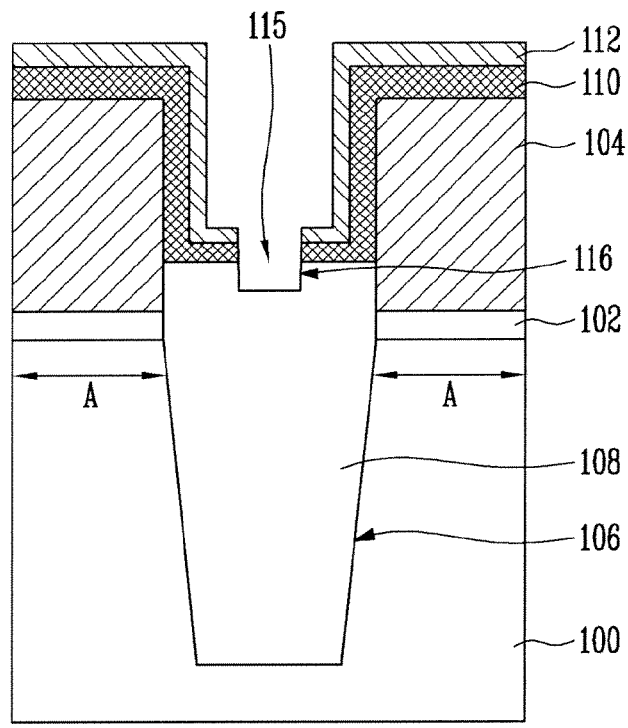

Referring to FIG. 2D, the isolation layer 108 exposed through the first trench 115 is etched, thereby forming a second trench 116 in the isolation layer 108. The etch process of etching the isolation layer 108 may be performed using a dry etch process or a wet etch process. The second trench 116 may have up to a depth corresponding to the height of the surface of the active region A of the semiconductor substrate 100 by taking a cycling characteristic of the tunnel insulating layer 102 into consideration. Accordingly, the isolation layer 108 exposed through the first trench 115 is etched, thereby forming the concave trench 116 at the central portion of the top of the isolation layer 108.

Further, a wing spacer is automatically formed on the sidewalls of the tunnel insulating layer 102 by the second trench 116. Accordingly, unlike a known method of fabricating a flash memory device, repeated processes required to form the wing spacer on the sidewalls of the tunnel insulating layer, such as a deposition process and an etch process using two or more kinds of materials for forming the isolation layer, may be omitted, thereby being capable of simplifying a process of fabricating a flash memory device.

In the process of forming the second trench 116, the remaining etch barrier layer (refer to 114 in FIG. 2C) is removed together with the isolation layer, so the surface of the remaining capping layer 112 is completely exposed. However, the surface of the dielectric layer 110 left in the etch process is not directly exposed by the capping layer 112, but is protected by the capping layer.

After the etch barrier layer 114 is removed, if carbon component remains on the semiconductor substrate 100, a cleaning process or a plasma process may be performed in order to fully remove carbon component remaining on the semiconductor substrate 100.

Figure 2E:
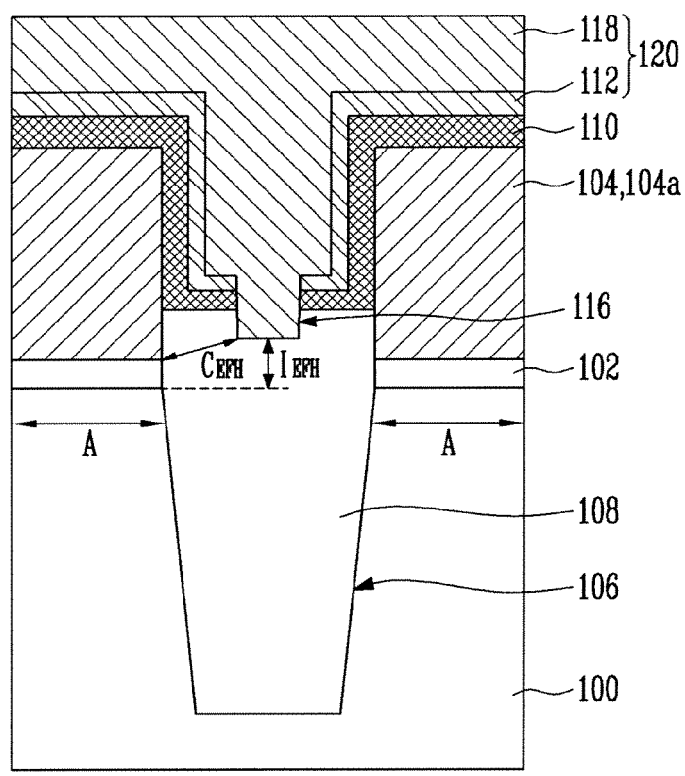

Referring to FIG. 2E, a second conductive layer 118 may be formed on the capping layer 112 including the second trench 116. The second conductive layer 108 is used as a control gate of the flash memory device and may be formed of a polysilicon layer, a metal layer, or a stack layer of them. The metal layer may be a metal silicide layer. The second conductive layer 118 may be formed of a polysilicon layer. In this case, the second conductive layer 118 is formed using a doped polysilicon layer.

The second conductive layer 118, the capping layer 112, the dielectric layer 110, and the first conductive layer 104 are patterned in a direction (a word line direction) crossing the isolation layer 108 using a known etch process. Consequently, floating gates 104a each including the first conductive layer 104 are formed, and a control gate 120, including the capping layer 112 and the second conductive layer 118, is formed. Accordingly, a gate pattern, including the tunnel insulating layer 102, the floating gate 104a, the dielectric layer 110, and the control gate 120, is formed.

According to the embodiment, since the control gate 120 is formed between the floating gates 104a and is placed on the dielectric layer 110, the height of the control gate 120 can be lowered by the sum of a thickness of the dielectric layer 110, corresponding to the upper horizontal portion of the isolation layer 108, and a thickness of the etched isolation layer 108 in the second trench 116, as compared with a known flash memory device. Accordingly, an area occupied by the control gate 120 may be increased by as much as a portion of the control gate, placed between the floating gates and configured to extend under the capping layer 112.

In general, in the case where the dielectric layer and the conductive layer for a control gate are formed after the trench is formed over the isolation layer or the concave top of the isolation layer is formed, the trench (or the concaved portion) is filled with the dielectric layer, so the conductive layer for the control gate may not be formed in the trench or a part of the conductive layer for the control gate may be formed. In accordance with one or more embodiments, however, the second trench 116 may be formed by etching the isolation layer 108 exposed through the first trench 115 formed in the dielectric layer 110. As described above, the second conductive layer 118 is formed in the second trench 116 and the first trench 115 of the dielectric layer 110. Accordingly, the dielectric constant between the floating gates 104a can be lowered as compared with a case where the dielectric layer 110, together with the second conductive layer 118, is formed in the trench of the isolation layer 108. That is, since the bottom surface of the second conductive layer 118 may be lowered as compared with the known art, parasitic capacitance between the floating gates 104a may be lowered, so the interference effect may be minimized.

Furthermore, according to one or more embodiments, although the isolation layer 108 is formed high before the dielectric layer 110 is formed in order to secure a distance CEFH between the tunnel oxide layer 102 and the control gate 120, which is pertinent to a cycling characteristic, an EFH IEFH pertinent to the interference effect can be lowered by etching the isolation layer 108, exposed through the first trench 115 formed in the dielectric layer 110, in a subsequent process. Accordingly, according to one or more embodiments, the interference effect can be improved and, at the same time, the distance CEFH between the tunnel oxide layer 102 and the control gate 120 can be lowered. Consequently, a cycling Vt shift, which becomes worse when the tunnel oxide layer 102 is close to the control gate 120, can be reduced, thereby reducing the deterioration of the tunnel oxide layer 102.

FIGS. 3A to 3G are sectional views illustrating a method of fabricating a flash memory device according to another embodiment.

Figure 3A:
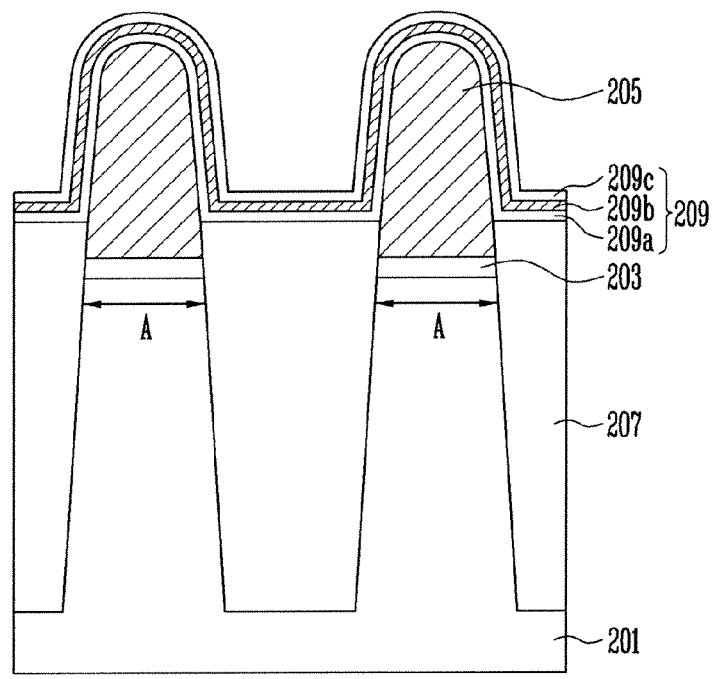
FIGS. 3A to 3G are sectional views illustrating a method of fabricating a flash memory device according to another embodiment.

Referring to FIG. 3A, there is provided a semiconductor substrate 201 in which a tunnel oxide layer 203 and a first conductive layer 205 are stacked over active regions A and isolation layers 207 are formed in isolation regions between the active regions A using a typical method of fabricating a flash memory device. The method of stacking the tunnel oxide layer 203 and the first conductive layer 205 over the active regions A and forming the isolation layers 207 in the respective isolation regions is identical to that described with reference to FIG. 2A, and a description thereof is omitted for simplicity.

As described above, after the semiconductor substrate 201 in which the tunnel oxide layer 203 and the first conductive layer 205 are stacked over the active regions A and the isolation layers 207 are formed in the respective isolation regions is provided, a dielectric layer 209 are formed on a surface of the isolation layers 207 and the first conductive layer 205. The dielectric layer 209 may have a structure in which a first oxide layer 209a, a nitride layer 209b, and a second oxide layer 209c are stacked (Oxide-Nitride-Oxide; ONO).

Figure 3B:
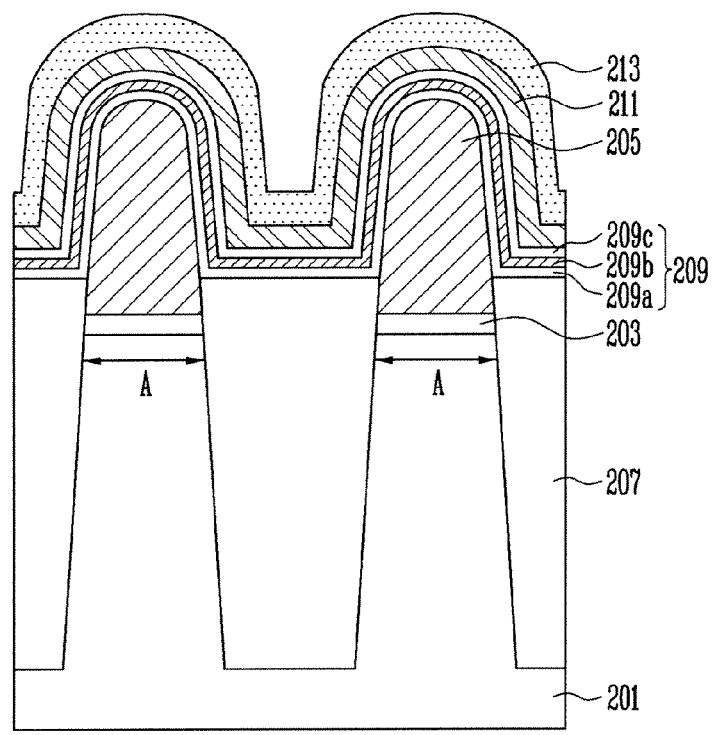

Referring to FIG. 3B, a capping layer 211 is further formed over the dielectric layer 209. The capping layer 211 functions to protect the dielectric layer 209 so that the dielectric layer 209 is not directly exposed in a subsequent etch process, a cleaning process, and a strip process. Further, the capping layer 211 may be formed using a conductive layer so that the capping layer 211 may be used as a lower conductive layer for a control gate. The capping layer 211 may be made of polysilicon. The polysilicon layer constituting the capping layer 211 may include a doped polysilicon layer including a dopant such as phosphorous (P). Here, the doped polysilicon layer is configured to include a dopant of 1.0E20 atoms/cm.sup.3 to 3.0E20 atoms/cm.sup.3 and is formed to a thickness of 50 to 200 Å.

An etch barrier layer 213 is deposited on a surface of the capping layer 211. The etch barrier layer 213 is configured to expose the capping layer 209 formed on the isolation layers 207 and the sidewalls of first conductive layer 205 after a subsequent etch process and may be deposited by a method using a step coverage characteristic so that the capping layer 211 formed over the first conductive layer 205 may be protected. That is, the etch barrier layer 213 may be formed thicker over a top of the first conductive layer 205 than over the isolation layers 207 and on the sidewalls of the first conductive layer 205. To this end, the etch barrier layer 213 may be deposited using a plasma method. Furthermore, the etch barrier layer 213 may be made of material which may be easily removed using a subsequent process without an additional removed process. For this purpose, the etch barrier layer 213 may be formed using an oxide layer, more particularly, a Plasma Enhanced (PE)-oxide layer.

The PE-oxide layer may be formed by injecting a mixed gas of SiH4 gas and O2 gas into a chamber in a temperature range of 350 to 450° C. and then using a plasma using a carrier gas, such as He or Ar.

Figure 3C:
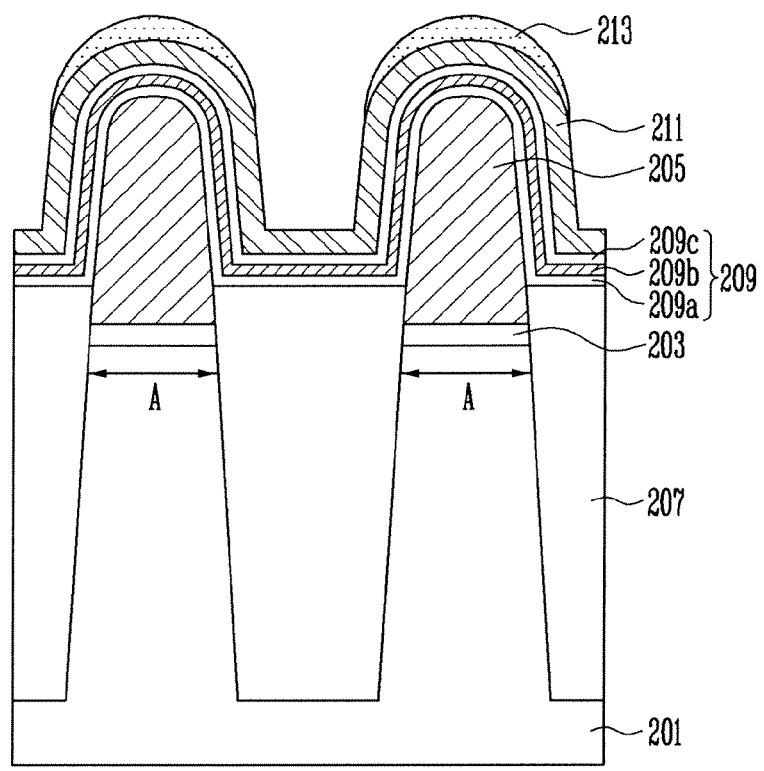

Referring to FIG. 3C, the etch barrier layer 213 is exposed so that the capping layer 209 formed over the isolation layer 207 and the capping layer 209 formed on the sidewalls of the first conductive layer 205 are exposed. The etch barrier layer 213 formed over the first conductive layer 205 remains intact because it is relatively thicker than the etch barrier layer 213 formed over the isolation layer 207 and on the sidewalls of the first conductive layer 205. The etch barrier layer 213 may be etched using fluoric acid (HF) or a Buffer Oxide Etchant (BOE).

Figure 3D:
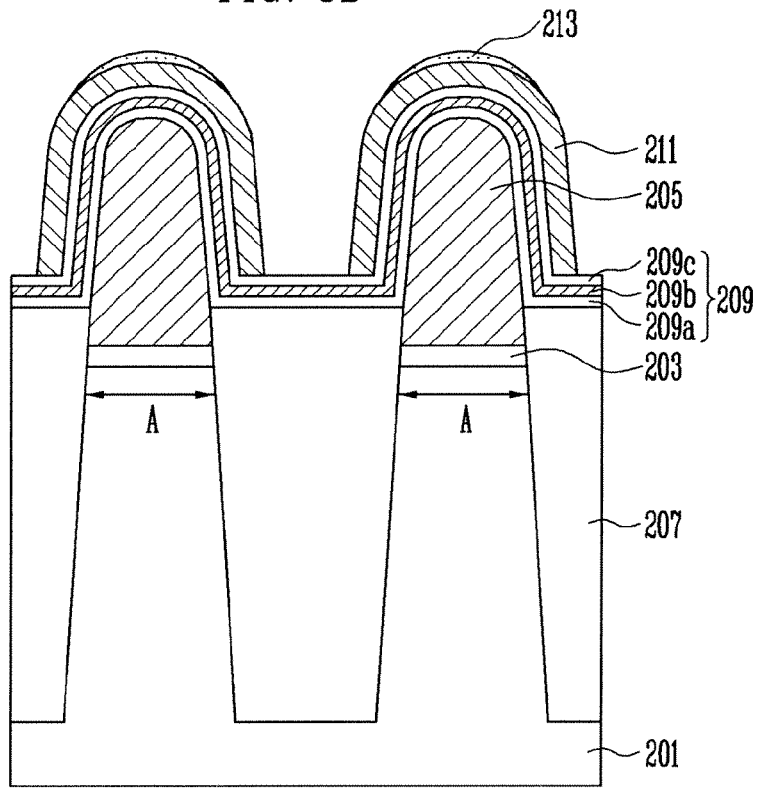

Referring to FIG. 3D, the dielectric layer 209 on the isolation layer 207 is exposed by etching the capping layer 211 over the isolation layer 207 exposed in FIG. 3C. When the capping layer 211 is etched, the capping layer 211 under the remaining etch barrier layer 213 remains intact because it is protected by the etch barrier layer 213. Accordingly, after the etch process is performed on the capping layer 211, the dielectric layer 209 on the isolation layer 207 is exposed, and the dielectric layer 209 under the capping layer 211 protected by the etch barrier layer 213 is not exposed. That is, the dielectric layer 209 formed on the top and sidewalls of the first conductive layer 205 are not exposed. The capping layer 211 made of polysilicon may be etched using any one of a mixed gas of SF6 gas and O2 gas, a mixed gas of Cl2 gas and O2 gas, and a mixed gas of SF6 gas, Cl2 gas, and O2 gas.

Figure 3E:
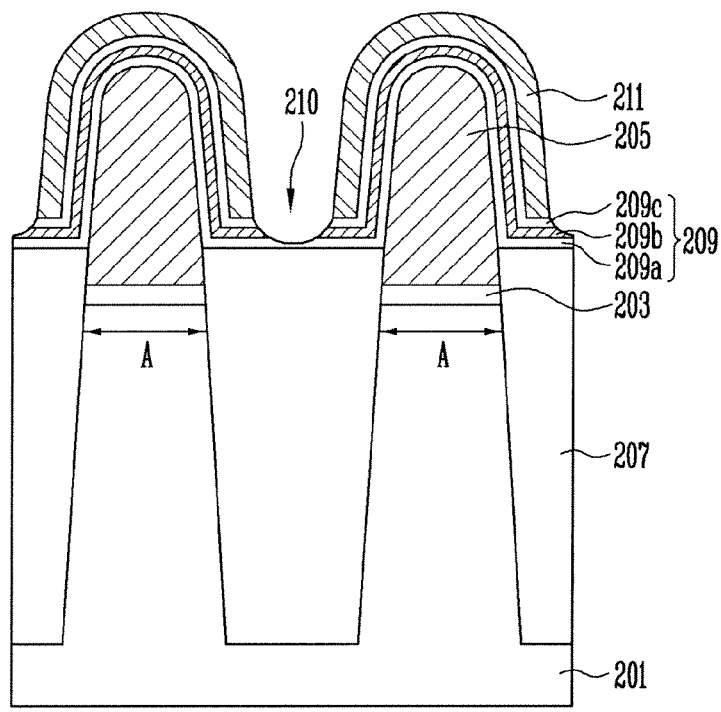

Referring to FIG. 3E, a first trench 210 is formed in the dielectric layer 209 by etching the dielectric layer 209 on the isolation layer 207 exposed after the etch process is performed on the capping layer 211 in FIG. 3D. The etch process of forming the first trench 210 may be performed using dry etch. Here, the dielectric layer 209 formed on the isolation layer 207 may be etched partially or completely. The groove 210 through which the first oxide layer 209a of the dielectric layer 209 is exposed or the isolation layer 207 is exposed through the dielectric layer 209 is defined by the etch of the dielectric layer 209. Furthermore, when the dielectric layer 209 is etched, the remaining etch barrier layer 213 is etched. When the etch process of forming the first trench 210 is performed, the capping layer 211 formed using the polysilicon layer operates to protect the dielectric layer 209 formed on the top and sidewalls of the first conductive layer 205 so that the dielectric layer 209 is not etched.

Figure 3F:
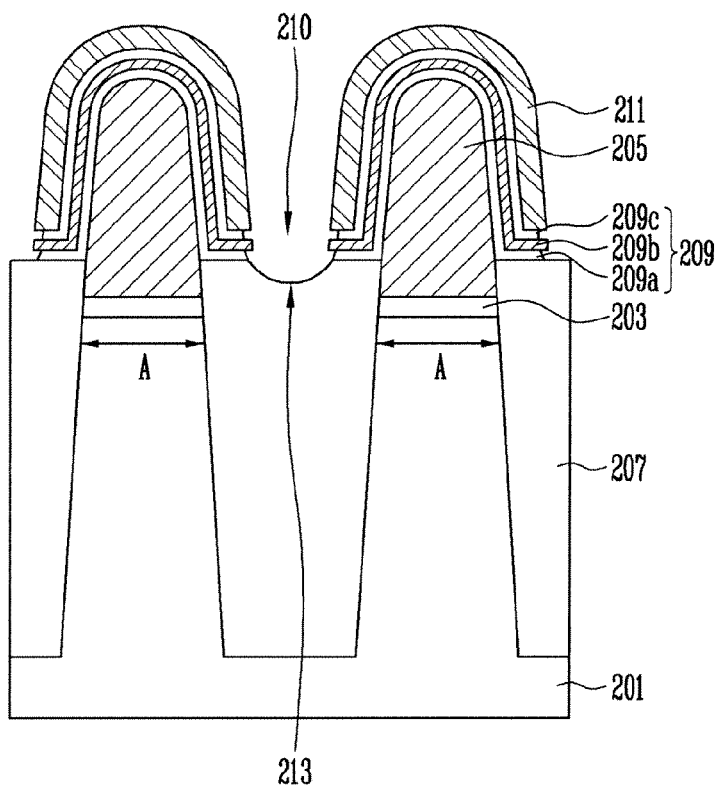

Referring to FIG. 3F, a wet etch process is further performed in order to widen the width of the bottom surface of the first trench 210, so both the first oxide layer 209a and the second oxide layer 209c of the dielectric layer 209 are etched. Accordingly, the nitride layer 209b remains more protruded than the first and second oxide layers 209a and 209c on the sidewalls of the first trench 210. That is, an irregular form (凹凸) is formed on the sidewalls of the first trench 210. Since the width of the bottom surface of the first trench 210 is widened as described above, a tip may be prevented from occurring on the bottom surface of a second conductive layer which will be formed within the first trench 210 in a subsequent process. Accordingly, one or more embodiments can prevent a phenomenon in which an electric field is concentrated on the tip formed in the second conductive layer because charges are concentrated on the tip when a flash memory device is driven. Furthermore, since the wet etch process is performed, the etch barrier layer 213 which may remain on the top of the capping layer 211 is fully removed. The capping layer 211 functions to protect the dielectric layer 209, formed on the top and sidewalls of the first conductive layer 205, so that the dielectric layer 209 is not etched when the etch process of widening the width of the bottom surface of the first trench 210 is performed.

Furthermore, since the wet etch process is performed, the isolation layer 207 under the first trench 210 is etched, so a second trench 213 may be formed in the isolation layer 207.

Figure 3G:
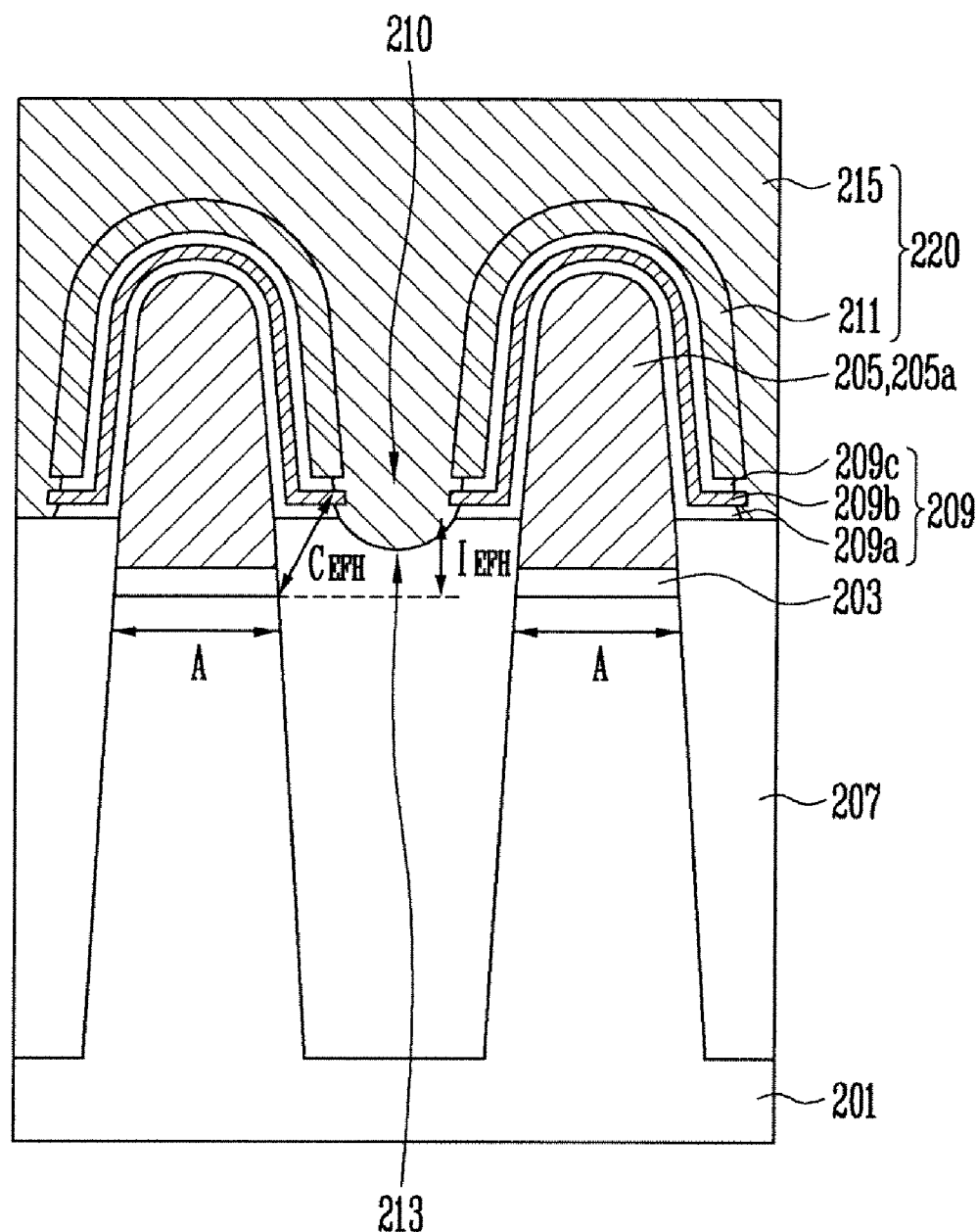

Referring to FIG. 3G, a second conductive layer 215 configured to fill the first trench 210 and the second trench 213 is formed on the capping layer 211. The second conductive layer 215 is a conductive layer for a control gate and may be formed to a thickness enough to fill space between the first trench 210 and the first conductive layer 205. Furthermore, the second conductive layer 215 may be formed using a doped polysilicon layer. Here, the doped polysilicon layer may include a dopant having 1.0E20 atoms/cm3 to 3.0E20 atoms/cm3. The bottom surface of the second conductive layer 215 formed between the first conductive layers 205 may be formed low through the first trench 210 and the second trench 213 formed in the dielectric layer 209.

Next, the second conductive layer 215, the capping layer 211, the dielectric layer 209, and the first conductive layer 205 are patterned in a direction crossing the isolation layers 207 using a known etch process. Thus, the first conductive layer 205 connected in a direction parallel to the isolation layer 207 is divided into a number of patterns. Accordingly, floating gates 205a and the capping layer 211, formed of the first conductive layer 205, and a control gate 220, formed of the second conductive layer 215, are formed, thereby forming gate patterns in each of which the floating gate 205a, the dielectric layer 209, and the control gate 220 are stacked.

As described above, according to another embodiment, in the same manner as the one embodiment, the bottom surface of the second conductive layer 215 may be lowered by as much as the sum of the heights of the first trench 210 and the second trench 213 formed in the dielectric layer 209. Accordingly, the dielectric constant between the first conductive layers 205 may be lowered. Accordingly, the interference effect may be minimized because parasitic capacitance between the first conductive layers 205 may be lowered.

Furthermore, in another embodiment, although the isolation layer 207 is formed high before the dielectric layer 209 is formed in order to secure the distance CEFH between the tunnel oxide layer 203 and the second conductive layer 215, related to a cycling characteristic, the isolation layer 207 exposed through the first trench formed in the dielectric layer 209 is etched in a subsequent process, so an EFH IEFH related to an interference effect may be lowered. Accordingly, one or more embodiments can improve the interference effect and can also secure the distance CEFH between the tunnel oxide layer 203 and the second conductive layer 215. Consequently, a deterioration characteristic of the tunnel oxide layer 203 may be improved by reducing a cycling Vt shift which becomes worse when the tunnel oxide layer 203 is close to the second conductive layer 215.

Furthermore, in another embodiment, it is not necessary to remove the etch barrier layer 213 remaining on the sidewalls of the first conductive layer 205 after the first trench 210 is formed because the etch barrier layer 213 remains only on the top of the first conductive layer 205 in order to form the first trench 210 in the dielectric layer 209. Accordingly, the isolation layer 207 may be easily controlled because the isolation layer 209 may not be etched after the first trench 210 is formed. In more detail, the isolation layer 207 may be exposed through the first trench 210 formed in the dielectric layer 209. In the case where the etch barrier layer 213 remains on the sidewalls of the first conductive layer 205, the etch barrier layer 213 remaining on the sidewalls of the first conductive layer 205 has to be removed in the state in which the isolation layer 207 is exposed through the groove 21. In this case, since the isolation layer 207 exposed through the first trench 210 may be etched, the isolation layer 207 may be easily controlled. However, in one or more embodiments, the isolation layer 207 may be easily controlled because the etch barrier layer 213 may be removed using a series of processes until the first trench 210 is formed.

Furthermore, according to one or more embodiments, after the groove 210 is formed in the dielectric layer 209, the etch process of widening the width of the bottom surface of the first trench 210 is performed. Accordingly, a phenomenon in which an electric field is concentrated on a tip formed at the bottom of the second conductive layer 213 may be improved.

The present invention may have following advantages.

First, one or more embodiments can improve an interference effect occurring between the floating gates although the distance between cells decreases because the thickness of the dielectric layer and the height of the bottom of the control gate may be reduced up to the trench of the isolation layer. Accordingly, one or more embodiments can enhance the operating speed of a device.

Second, one or more embodiments can control the EFH IEFH for improving the interference effect because the trench is formed in the isolation layer through the first trench formed after the dielectric layer is formed although the EFH of the isolation layer is formed high before the dielectric layer is formed.

Third, one or more embodiments can secure the distance CEFH between the tunnel oxide layer and the control gate, which is pertinent to a cycling characteristic, through the isolation layer formed high before the dielectric layer is formed. Accordingly, the deterioration characteristic of the tunnel oxide layer may be improved because a cycling Vt shift is reduced.

Fourth, according to one or more embodiments, repetitive processes, such as deposition and etch, using two kinds of materials for forming the isolation layer having the wing spacers as in the prior art may be omitted because the trench is formed in the isolation layer through the first trench formed in the dielectric layer. Accordingly, the manufacturing process may be simplified.

As described above, one or more embodiments can lower the bottom of the control gate formed between the floating gates and secure the distance between the tunnel oxide layer and the control gate using a simplified and stabilized method. Accordingly, the reliability and productivity of a flash memory device may be improved.

What is claimed is:

1. A method of fabricating a flash memory device, comprising;
    providing a semiconductor substrate having active regions that are isolated by an isolation layer, wherein a tunnel oxide layer and a first conductive layer are stacked on the semiconductor substrate in each of the active regions, and the highest surface of the first conductive layer is higher in height than the highest surface of the isolation layer with respect to the semiconductor substrate;
    forming a dielectric layer along an entire surface of a structure including the isolation layer and the first conductive layer;
    etching the dielectric layer formed on the isolation layer to form a first trench in the dielectric layer;
    etching a portion of the isolation layer exposed through the first trench to form a second trench in the isolation layer; and
    forming a second conductive layer over a resulting structure after etching the portion of the isolation layer to fill the first trench, the second trench and a space between the first conductive layers of the active regions.

2. The method of claim 1, wherein a top surface of the isolation layer is placed between a top surface of the active regions of the semiconductor substrate and a top surface of the first conductive layer.

3. The method of claim 1, wherein the first trench in the dielectric layer is formed at a central position along a top surface of the isolation layer.

4. The method of claim 1, wherein the second trench is formed at a central portion of the isolation layer.

5. The method of claim 1, wherein the second trench extends up to a depth corresponding to a top surface of the active regions of the semiconductor substrate.

6. The method of claim 1, wherein etching the dielectric layer further comprises;
    forming an etch barrier layer along a surface of the dielectric layer, wherein the etch barrier layer is thicker over the first conductive layer than over the isolation layer; and
    etching a portion of the etch barrier layer and the dielectric layer on the isolation layer.

7. The method of claim 6, wherein the etch barrier layer is formed using any one of an amorphous carbon layer, a carbon-based material layer, a silicon nitride ($Si_xN_y$: "x" and "y" are positive integers) layer, a silicon oxynitride (SiON) layer, an oxide layer, and a boron nitride (BN) layer.

8. The method of claim 7, wherein forming the etch barrier layer using plasma enhanced chemical vapor deposition (PECVD) method or spin coating.

9. The method of claim 6, wherein the portion of the etch barrier layer and the dielectric layer formed on the isolation layer is etched by dry etch.

10. The method of claim 6, wherein the etching of the portion of the etch barrier layer and the dielectric layer on the isolation layer includes etching the etch barrier layer using a dry etch process and subsequently etching the dielectric layer using a wet etch process.

11. The method of claim 6, wherein the etch barrier layer is removed when the second trench is formed.

12. The method of claim 6, further comprises forming a capping layer between forming the etch barrier layer and forming the dielectric layer.

13. The method of claim 12, wherein the capping layer is formed by using a PECVD.

14. The method of claim 12, wherein the capping layer is formed of a polysilicon layer.

15. The method of claim 12, wherein the capping layer is etched through a wet etch after etching the portion of the etch barrier layer.

16. The method of claim 6, further comprises forming a photoresist pattern for exposing the portion of the etch barrier layer on the isolation layer.

17. The method of claim 1, wherein forming the dielectric layer using PECVD.

18. The method of claim 1, further comprising, between forming the second trench and forming the second conductive layer, removing carbon component remaining on the semiconductor substrate.

19. The method of claim 1, wherein the step of forming the first trench comprises:
forming an etch barrier layer over the dielectric layer;
etching the etch barrier layer formed on a sidewall of the first conductive layer and a top of the isolation layer so that the etch barrier layer remains on a top of the first conductive layer; and
etching the dielectric layer exposed at a portion from which the etch barrier layer has been etched.

20. The method of claim 19, further comprising the step of forming a capping layer on the dielectric layer using a polysilicon layer before the etch barrier layer is formed.

21. The method of claim 20, wherein:
the capping layer formed on the isolation layer is exposed in the step of etching the etch barrier layer formed on the sidewall of the first conductive layer and on the top of the isolation layer, and the exposed capping layer is removed before the step of etching the dielectric layer.

22. The method of claim 21, wherein the step of removing the exposed capping layer is performed using one of a mixed gas of SF6 gas and O2 gas, a mixed gas of Cl2 gas and O2 gas, and a mixed gas of SF6 gas, Cl2 gas, and O2 gas.

23. The method of claim 19, wherein the etch barrier layer is thicker on the top of the first conductive layer than on the sidewall of the first conductive layer and on the top of the isolation layer.

24. The method of claim 19, wherein the etch barrier layer is formed using a Plasma-Enhanced (PE) oxide layer.

25. The method of claim 19, wherein the remaining etch barrier layer is etched in the step of forming the first trench.

26. The method of claim 19, further comprising, after the step of forming the first trench, widening a width of the bottom of the first trench.

27. The method of claim 26, wherein the step of widening the width of the bottom of the first trench is performed at the same time when a second trench is formed in the isolation layer, wherein the second trench is formed after the step of forming the first trench.

28. The method of claim 26, wherein the step of widening the width of the bottom of the first trench is performed using a wet etch process.

29. The method of claim 26, wherein in the step of widening the width of the bottom of the first trench, the etch barrier layer is fully removed.

30. The method of claim 1, wherein a portion of the dielectric layer exposed through sidewalls of the first trench is etched when the second trench is formed.

31. The method of claim 30, wherein the portion of the dielectric layer exposed through sidewalls of the first trench is etched using a wet etch process.

* * * * *